United States Patent
Qin et al.

(10) Patent No.: US 10,431,678 B2
(45) Date of Patent: Oct. 1, 2019

(54) TERMINATION DESIGN FOR TRENCH SUPERJUNCTION POWER MOSFET

(71) Applicant: NXP USA, Inc., Austin, TX (US)

(72) Inventors: Ganming Qin, Austin, TX (US);
Vishnu Khemka, Austin, TX (US);
Ljubo Radic, Austin, TX (US);
Bernhard Grote, Austin, TX (US);
Tanuj Saxena, Austin, TX (US);
Moaniss Zitouni, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/038,463

(22) Filed: Jul. 18, 2018

(65) Prior Publication Data
US 2019/0148541 A1 May 16, 2019

Related U.S. Application Data

(62) Division of application No. 15/809,954, filed on Nov. 10, 2017, now Pat. No. 10,103,257.

(51) Int. Cl.
| | |
|---|---|
| *H01L 29/78* | (2006.01) |
| *H01L 29/06* | (2006.01) |
| *H01L 29/66* | (2006.01) |
| *H01L 21/768* | (2006.01) |
| *H01L 21/762* | (2006.01) |
| *H01L 29/40* | (2006.01) |
| *H01L 29/423* | (2006.01) |

(52) U.S. Cl.
CPC .... *H01L 29/7813* (2013.01); *H01L 21/76205* (2013.01); *H01L 21/76816* (2013.01); *H01L 29/0634* (2013.01); *H01L 29/0649* (2013.01); *H01L 29/0696* (2013.01); *H01L 29/407* (2013.01); *H01L 29/4238* (2013.01); *H01L 29/66666* (2013.01); *H01L 29/66734* (2013.01); *H01L 29/7811* (2013.01); *H01L 29/0611* (2013.01); *H01L 29/0638* (2013.01)

(58) Field of Classification Search
None
See application file for complete search history.

(56) References Cited

U.S. PATENT DOCUMENTS

| | | | |
|---|---|---|---|
| 9,299,776 B2 | 3/2016 | Grivna et al. | |
| 9,306,018 B2 | 4/2016 | Burke et al. | |
| 9,324,800 B1 * | 4/2016 | Ku | H01L 29/66666 |
| 9,472,662 B2 | 10/2016 | Stefanov et al. | |
| 9,515,178 B1 | 12/2016 | Qin et al. | |
| 9,673,318 B1 * | 6/2017 | Mirchandani | H01L 29/7813 |

(Continued)

*Primary Examiner* — Dung A. Le
(74) *Attorney, Agent, or Firm* — Charlene R. Jacobsen (57) ABSTRACT

A plurality of trench stripes are disposed in parallel in an epitaxial layer on a drain and extends from a top region to a bottom region of a first surface of the semiconductor. A first polysilicon layer is in each of the trench stripes. The first polysilicon layer extends between the drain and the first surface proximal to the top region and the bottom region, and between the drain and a level below the first surface in a middle region between the top region and the bottom region. A second polysilicon layer is over the first polysilicon layer in the middle region, wherein the first poly silicon layer forms a shield, and the second polysilicon layer forms a gate. A source is in a silicon mesa stripe surrounding the first trench stripe.

5 Claims, 8 Drawing Sheets

(56) References Cited

U.S. PATENT DOCUMENTS

| | | |
|---|---|---|
| 9,837,526 B2 | 12/2017 | Dupuy et al. |
| 2010/0140697 A1 | 6/2010 | Yedinak et al. |
| 2014/0273374 A1* | 9/2014 | Yedinak ............ H01L 29/66727 |
| | | 438/272 |
| 2016/0064556 A1 | 3/2016 | Qin et al. |
| 2016/0336394 A1* | 11/2016 | Hu ...................... H01L 29/0623 |

\* cited by examiner

PRIOR ART

TERMINATION DESIGN FOR TRENCH SUPERJUNCTION POWER MOSFET

CROSS-REFERENCE TO RELATED APPLICATIONS

The present application is a Divisional of pending U.S. patent application Ser. No. 15/809, 954, entitled "TERMINATION DESIGN FOR TRENCH SUPERJUNCTION POWER MOSFET," filed on 10 Nov. 2017, the entirety of which is herein incorporated by reference.

FIELD

This disclosure relates generally to power MOSFETs, and more specifically to a semiconductor design of a power MOSFET for improving breakdown voltage characteristics.

BACKGROUND

Vertical Field Effect Transistors (FETs) are suitable for high voltage applications due to their relatively high breakdown voltage, compared to FETs with shorter conduction channels. A trench superjunction power Metal Oxide Semiconductor FET (MOSFET) is a type of vertical FET typically using the reduced surface field (RESURF) effect. RESURF achieves a lower on resistance (RDSon) while still maintaining a high breakdown voltage (BVdss). In the case of an n-channel FET (NFET), RESURF is implemented in some configurations with a P doped column in an N– doped epitaxial layer grown over an N+ doped drain. In other configurations, an insulated field plate is used instead of the P doped column.

In some configurations, the N+ doped drain is an N+ substrate. Insulated field plates are arranged in trenches etched into the N– epitaxial layer grown over the drain. The N– epitaxial layer, (e.g. "epi-layer"), is also a lightly doped N– drift area of the FET, with a drain formed by the more heavily doped N+ substrate, a source formed by a heavily doped N+ region on the surface of the epi-layer, a body with a P type dopant formed for a MOSFET channel, and a gate formed between the field plate and the surface. As a result of the high-resistivity epi-layer traditionally used to support a high breakdown voltage, the on-state resistance of the FET is large. By using the RESURF effect, the drift area can be reduced substantially and/or the conductivity can be increased by using higher doping, either of which will reduce the on-state resistance without unduly compromising high breakdown voltage.

RESURF uses charge balancing to more evenly distribute the electric field strength between the source and the drain. Specifically in an NFET, the field plates are grounded to generate a negative charge distributed along the length of the plate. This distributed charge provides field termination of the positive charge in the drift area, rather than terminating the positive charge on the surface of the epi-layer at the source. Accordingly, the doping concentration of the epi-layer can be increased to lower the on-resistance.

To increase the current capacity of trench superjunction power MOSFETs, the gate area may also be increased by forming a 2-dimensional array of gates, or by forming multiple stripes of gate electrodes connected in parallel. The gate area, (also referred to as the inter-active cell area), is enclosed by a termination or isolation ring to isolate the power FET from a drain voltage and other integrated circuitry. Proper design and layout of the trench superjunction power MOSFET is important for achieving good voltage breakdown characteristics.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods described herein provide for improved voltage breakdown characteristics by rotating a silicon mesa around a gate trench finger structure, rather than using the conventional approach of rotating the gate trench around a silicon mesa finger structure. In various embodiments, contacts to a shield formed under the gate trench are made to a "triple point" location defined by the intersection of three trenches that include the shield. Contacting the shield at the triple point location improves the shield overlap of the contacts and is synergistic with the improved layout using rotation of the silicon mesa around the gate trench fingers. Advantageously, the triple point contact and layout embodiments of this disclosure enable use of a single metal fabrication process for reduced cost and complexity, in addition to improved layout density.

Furthermore, the disclosed embodiments of trench layouts enable an optimal doping concentration of the epi-layer to improve the voltage breakdown of the power MOSFET by significantly reducing the dependency of the optimized doping concentration with respect to the position along the gate trench. Specifically, previous solutions have required a different optimized doping concentration along a linear portion of the gate trench compared to a portion of the gate trench having a rotated or semi-circular shape. The advantages of the aforementioned embodiments are not exhaustive, nor are they intended to limit the scope of this disclosure.

Figure 1:
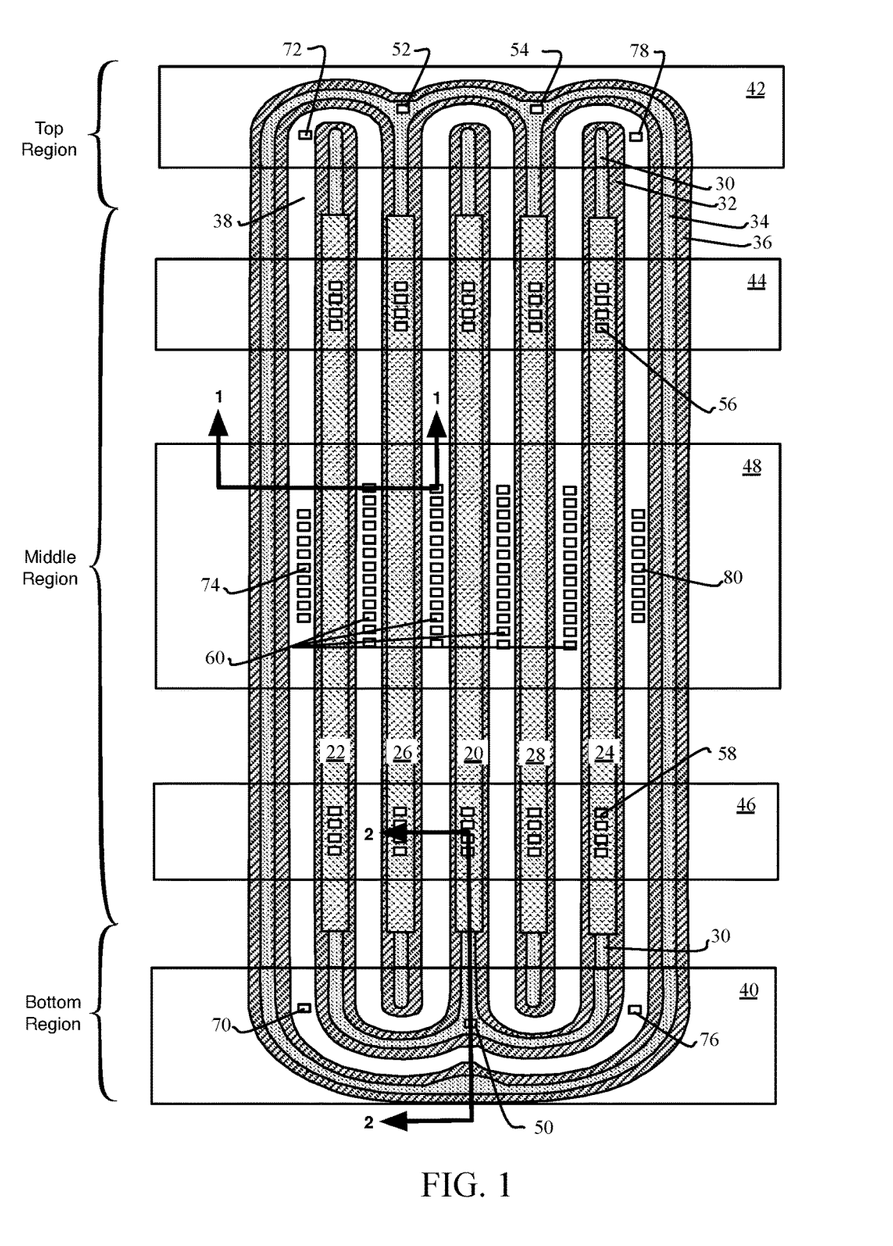
FIG. 1 is a plan view of a trench superjunction power MOSFET in accordance with an embodiment of the present disclosure.

FIG. 1 shows an embodiment 10 of a trench superjunction power MOSFET. The embodiment 10 includes a first gate 20, in parallel with a second gate 22 and a third gate 24. A fourth gate 26 is interposed between the first gate 20 and the second gate 22. A fifth gate 28 is interposed between the first gate 20 and the third gate 24. For clarity of the exposition, the following embodiments are based on an NFET, however the teachings are also applicable to embodiments based on a P-channel FET (PFET), where the doping polarities of the PFET are reversed from the NFET.

A first shield 30 is formed with a deposited polysilicon layer in a first trench 32. The first gate 20, the second gate 22, and the third gate 24 are formed with a second polysilicon layer deposited over the first shield 30 with dielectric isolation. The portions of the shield that extend between the overlying gates and the drain are referred to a partial shields. Conversely, the portions of the shield that are not covered by a gate that extend between the surface of the semiconductor and the drain are referred to as full shields. The partial shields extend along their respective trenches in a middle region. The full shields extend along their respective trenches in the top region and the bottom region. In the embodiment 10, the first shield 30 forms a continuous conduction path connecting the partial shields underlying the first gate 20, the second gate 22 and the third gate 24. Similarly, a second shield 34 in a second trench 36 forms a continuous conduction path connecting the partial shields underlying the fourth gate 26 and the fifth gate 28. The second shield 34 further encircles the five gates 20, 22, 24, 26 and 28 to form a continuous shield around the inter-active area including the gates.

In the embodiment 10, five interleaved gate fingers are shown, however other embodiments have a different odd number of fingers, (e.g., three, seven, nine, or greater odd numbers), with a similar layout having a scalloped shaped second shield 34 (or series of semicircular portions) encircling a first shield 30. A silicon mesa 38 extends between the first trench 36 and the second trench 32 with a serpentine shape. The silicon mesa 38 is the residual silicon area, after trench formation, extending to the surface of the semiconductor and enclosed by the second trench 36.

A first shield conductor 40 is located in the bottom region, and a second shield conductor 42 is located in the top region. A first gate conductor 44 extends through the middle region proximate to the top region, and a second gate conductor 46 extends through the middle region proximate to the bottom region. A source conductor 48 is interposed in the middle region, between the first gate conductor 44 and the second gate conductor 46. The first shield conductor 40 is connected to the first shield 30 by a contact 50, located at a "triple-point" of the second shield 34. Similarly, the second shield conductor 42 is connected to the second shield 34 by contacts 52 and 54, located at a "triple-point" of the second shield 34.

The triple-point is a location defined by an intersection of the centerlines of three portions of a shield. For example, the contact 50 is located at a triple-point defined by the intersection of a first portion of the first shield 30 extending from the first gate 20, a first semicircular portion of the first shield 30 encircling the fourth gate 26, and a second semicircular portion of the first shield 30 encircling the fifth gate 28.

The embodiment 10 of the superjunction power MOSFET maximizes a radius of the second shield 34 pivoting around the first shield 30 (e.g., at the first gate 20, second gate 22 and third gate 24), and also a radius of the first shield 30 pivoting around the second shield 34 (e.g., at the fourth gate 26 and the fifth gate 28). In other embodiments, the semicircular portions of the shield are replaced with substantially semicircular portions, while retaining most of the benefit of electric field reduction between the first shield 30 and the second shield 34, and thus improved voltage breakdown.

The first gate conductor 44 connects to the first gate 20, the second gate 22, the third gate 24, the fourth gate 26 and the fifth gate 28 through one or more contacts 56 for each gate. The number of contacts 56 per gate varies between embodiments, depending upon the width of the first gate conductor, and desired aggregate contact resistance for example. Similarly, the second gate conductor 46 connects to the first gate 20, the second gate 22, the third gate 24, the fourth gate 26 and the fifth gate 28 through one or more contacts 58 for each gate. The source conductor 48 connects to a plurality of source regions extending parallel to one or both sides of each of the gates 20, 22, 24, 26 and 28 with a plurality of contacts 60.

In some embodiments, a buried body region (not shown) extends in parallel with, and between, the second gate 22 and the second shield 34, connects to the first shield conductor 40 with a contact 70, connects to the second shield conductor 42 with a contact 72, and connects to the source conductor 48 with one or more contacts 74. Similarly, a buried body region (not shown) extends in parallel with, and between, the third gate 24 and the second shield 34, connects to the first shield conductor 40 with a contact 76, connects to the second shield conductor 42 with a contact 78, and connects to the source conductor 48 with one or more contacts 80. In another embodiment, the buried body region extends between, and in parallel with, gates (e.g., between the first gate 20 and the fourth gate 26) formed between the source and drain, to connect the first shield conductor 40, the second shield conductor 42 and the source conductor 48 together. In some embodiments, the first shield conductor 40, the second shield conductor 42 and the source conductor 48 are connected with a metal interconnect extending orthogonal to the source conductor, and using the same metal layer in the semiconductor process used to fabricate the trench superjunction power MOSFET. In various embodiments, the semiconductor process is a single metal layer process.

Figure 2:
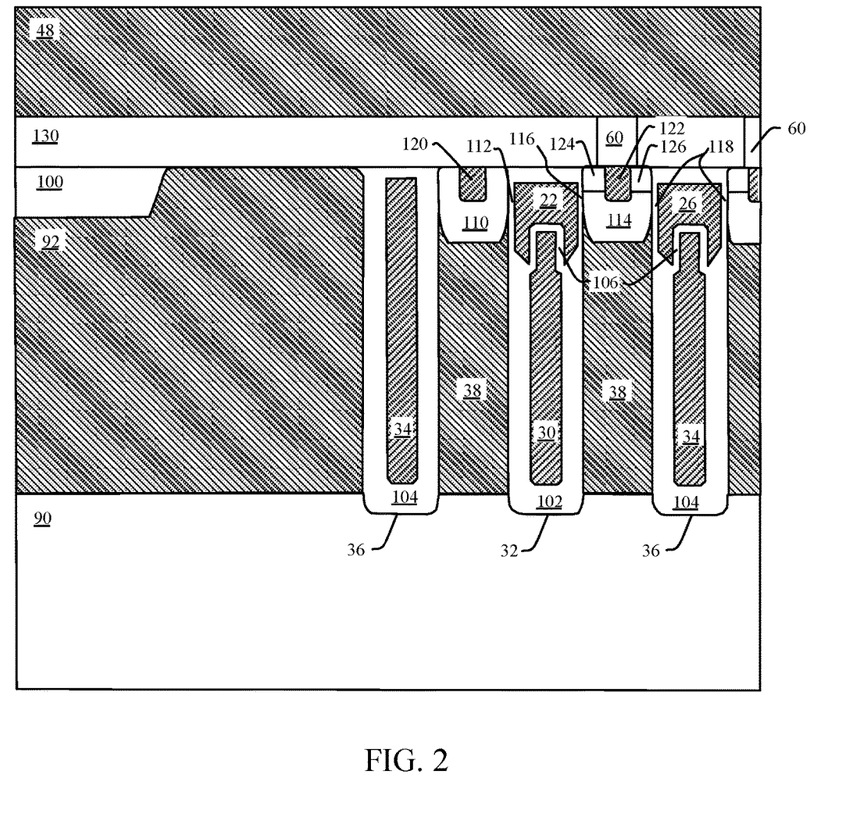
FIG. 2 is a cross-sectional view of FIG. 1 taken along the line 1-1.

FIG. 2 shows the cross-section along line 1-1 of embodiment 10 of FIG. 1. A doped substrate 90 forms a drain of a MOSFET. In some embodiments, a conductive electrode is attached to the substrate 90 to apply a substrate bias. An epitaxial layer 92 is grown on the substrate 90. For embodiments of an NFET, the substrate 90 is doped with an N++ dopant, and the epitaxial layer has relatively lighter doping with an N− dopant. In some embodiments, the substrate 90 has a <100> lattice orientation. In some embodiments, a shallow trench isolation region 100 is formed in the epitaxial layer 92 to further isolate the inter-active gate area from other circuitry integrated on the same substrate 90.

The first trench 32 is formed in the epitaxial layer 92. A first shield 30 is formed with polysilicon in the first trench 32 and is separated from the silicon mesa 38 by a trench drift oxide 102. The silicon mesa 38 is portion of the epitaxial layer 92 between the first trench 32 and the second trench 36. The second trench 36 is formed with polysilicon in the epitaxial layer 92. A second shield 34 is formed in the second trench 36 and is separated from the silicon mesa 38 by a trench drift oxide 104. In some embodiments, the trench drift oxide 102 has the same thickness and composition as the trench drift oxide 104. The second gate 22 is formed with a second polysilicon layer over the first shield 30 and separated by an inter-poly dielectric 106. Similarly, the fourth gate 26 is formed with the second polysilicon layer over the second shield 34 and separated by the inter-poly dielectric 106.

The second gate 22 is separated from a buried body region 110 by an oxide 112. In some embodiments, the buried body region 110 is a P– Well or P-Body region, doped with a P– dopant (e.g., Boron). The second gate 22 is separated from a P– well region 114 by a gate oxide 116. The fourth gate 26 is separated from the P– well region 114 by a gate oxide 118. In some embodiments, the gate oxide 116 has the same thickness and composition as the gate oxide 118. The buried body region 110 has a P+ conductor 120 providing a low impedance connection beneath the first gate conductor 44 (see FIG. 1) and the second gate conductor 46 (see FIG. 1), to connect the shields and source regions. The P-well region 114 includes a P+ source region 122, isolated by N+ regions 124 and 126. The source region 122 connects to the source conductor 48 through an interlayer dielectric 130 with a contact 60. The second gate 22 forms a conduction channel in the P-well 114 between the drain (e.g., substrate 90), and the source region 122, thereby forming a MOSFET.

Figure 3:
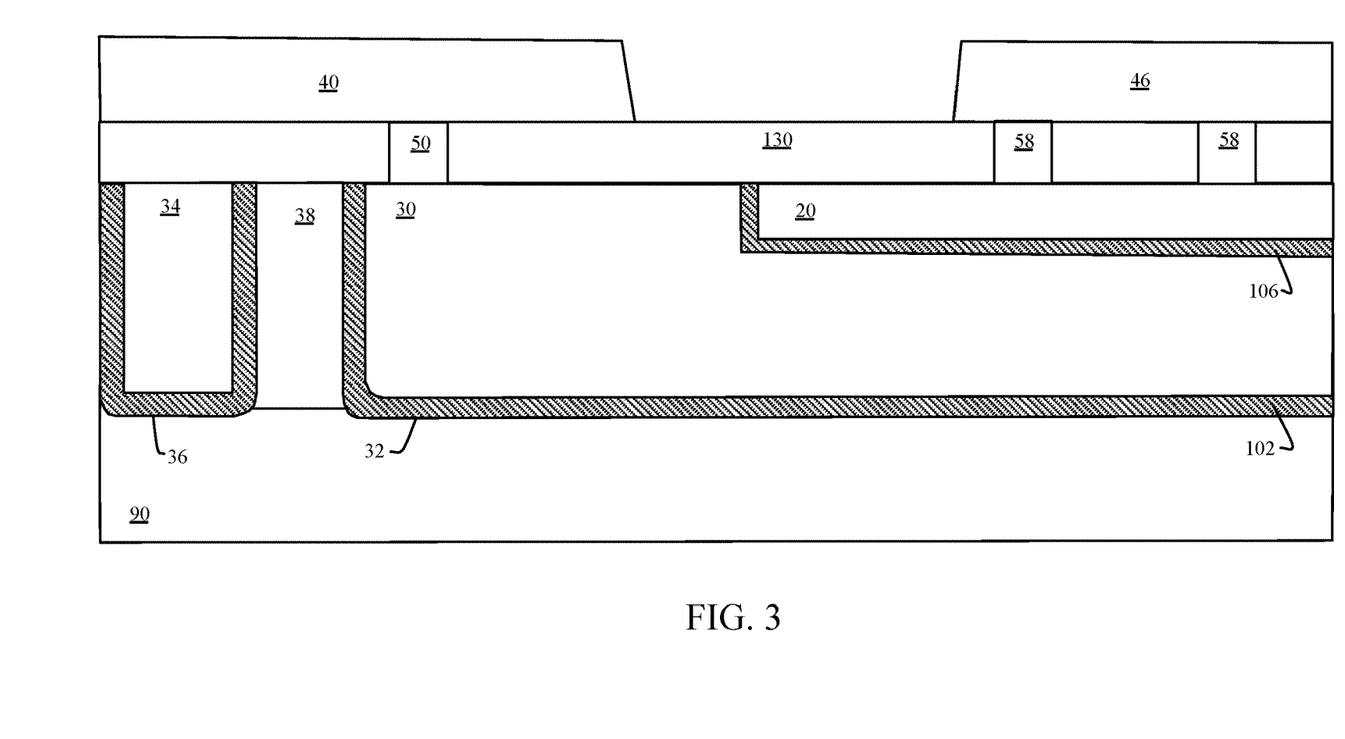
FIG. 3 is a cross-sectional view of FIG. 1 taken along the line 2-2.

FIG. 3 shows the cross-section along line 2-2 of embodiment 10 of FIG. 1. The first gate 20 is formed over the first shield 30, and isolated by the inter-poly dielectric 106. The first shield 30 is formed in the first trench 32, and isolated by the trench drift oxide 102. The first trench 32 is formed on a substrate 90, which also is a drain of a MOSFET. A second shield 34 is formed in a second trench 36. The first trench 32 is separated from the second trench 36 by the silicon mesa 38. The first gate 20 connects to the second gate conductor 46 through the interlayer dielectric 130 with contacts 58. The first shield 30 connects to the first shield conductor 40 through the interlayer dielectric 130 with a contact 50.

Figure 4:
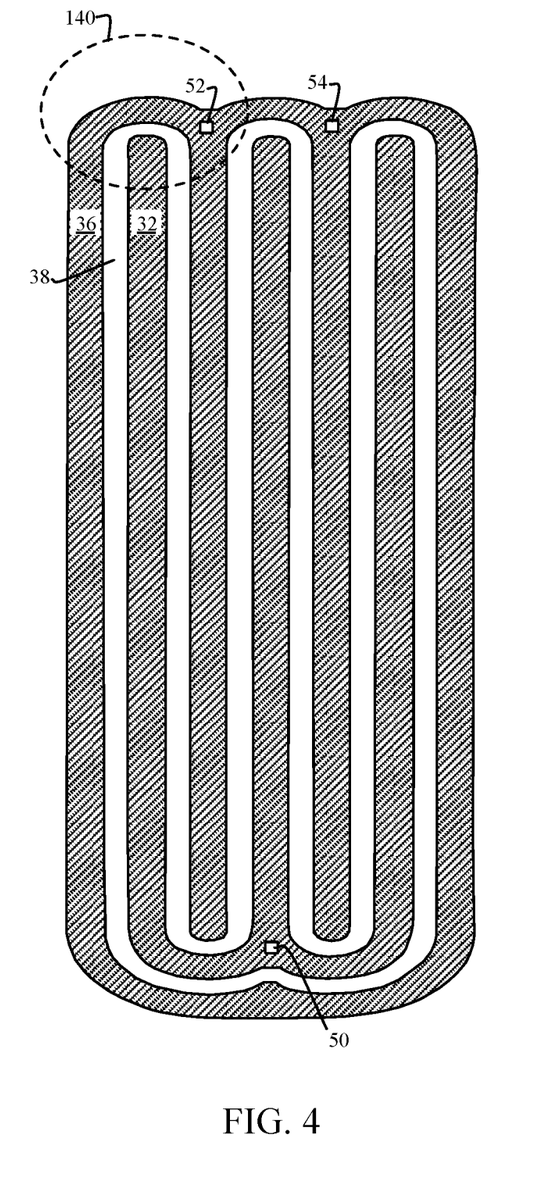
FIG. 4 is a plan view of the trench layers shown in FIG. 1

FIG. 4 shows further detail of the trench structures and the triple-points of the embodiment 10 of FIG. 1. The second trench 36 surrounds the first trench 32. The silicon mesa 38 is interposed between the first trench 32 and the second trench 36. Contact 50 is made to the triple point on the first shield 32. Contacts 52 and 54 are made to the triple points on second shield 36. The triple points are formed as a result of the rotation of the silicon mesa around the gate trench fingers, and improves the shield overlap of the contacts 50, 52 and 54. The region 140 is shown in more detail with the partial plan view of FIG. 6. The region 140 of FIG. 6 is further compared to a conventional partial plan view 140a of FIG. 5.

Figure 5:
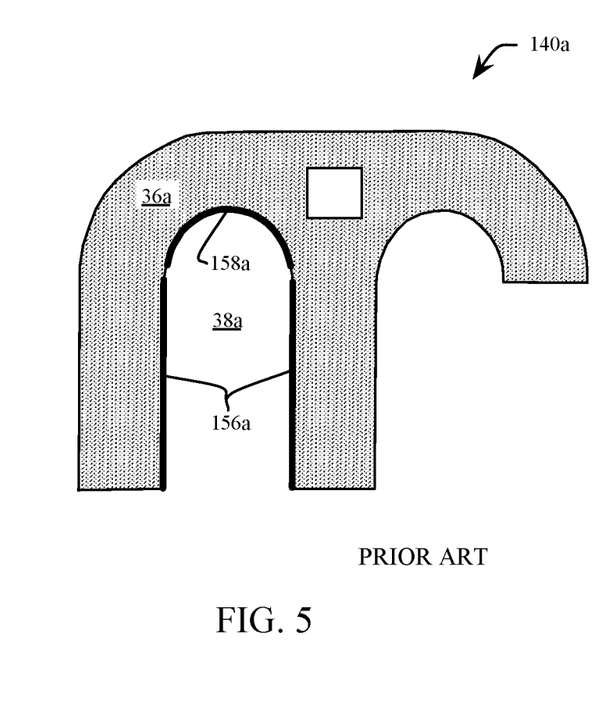
FIG. 5 is a partial plan view of a conventional trench layer layout for a power MOSFET.

FIG. 5 shows a partial view 140a of a conventional embodiment wherein a trench 36a surrounds a silicon mesa 38a, with a first break down region 156a and a second break down region 158a. In contrast, FIG. 6 shows the partial view 140 of the embodiment 10 including a silicon mesa 38 surrounding the trench 32, with a first breakdown region 156 and a second breakdown region 158.

Figure 6:
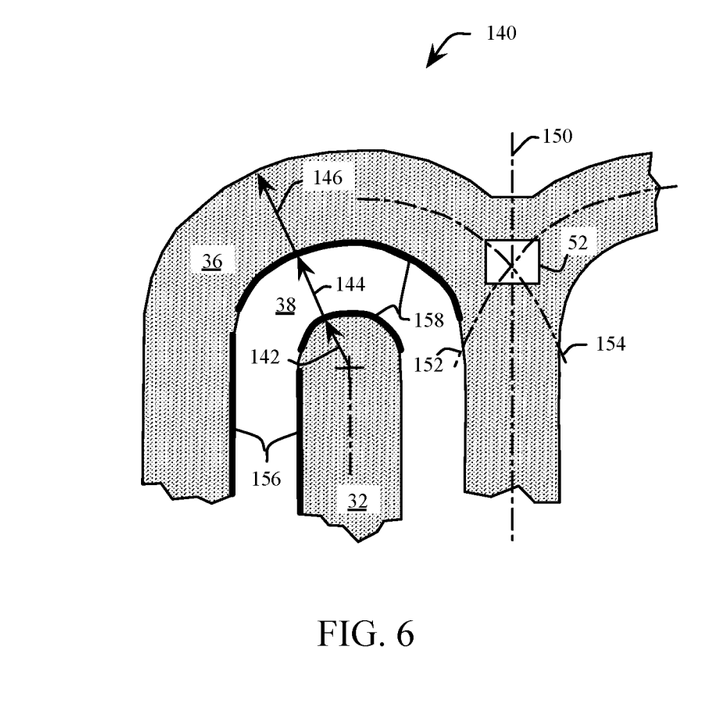
FIG. 6 is a partial plan view of FIG. 4.

With reference to FIG. 6, the first trench 32 has a first radius 142 (Wt/2) equal to half of the width of the first trench 32, or substantially equal to the width of the polysilicon forming the first shield 30 in the first trench 32 plus twice the width of the trench drift oxide (now shown). A second radius 144 is substantially equal to Wt/2 plus the silicon mesa width (Sx), between the first trench 32 and the second trench 36. A third radius 146 is substantially equal to half the width of the first trench 32 plus the silicon mesa width plus the width of the second trench 36, (e.g., Wt/2+Sx+Wt).

The contact 52 is located at a triple point defined by the intersection of a centerline 150 of a first portion of the second trench 36 extending from the fourth gate 26, a centerline 152 of a first semicircular portion of the second trench 36 encircling the first gate 20, and a centerline 154 of a second semicircular portion of the second trench 36 encircling the second gate 22. The triple point is similarly defined by substituting the centerlines of the second trench 36 for the corresponding (and coincident) centerlines of the second shield 34.

Figure 7:
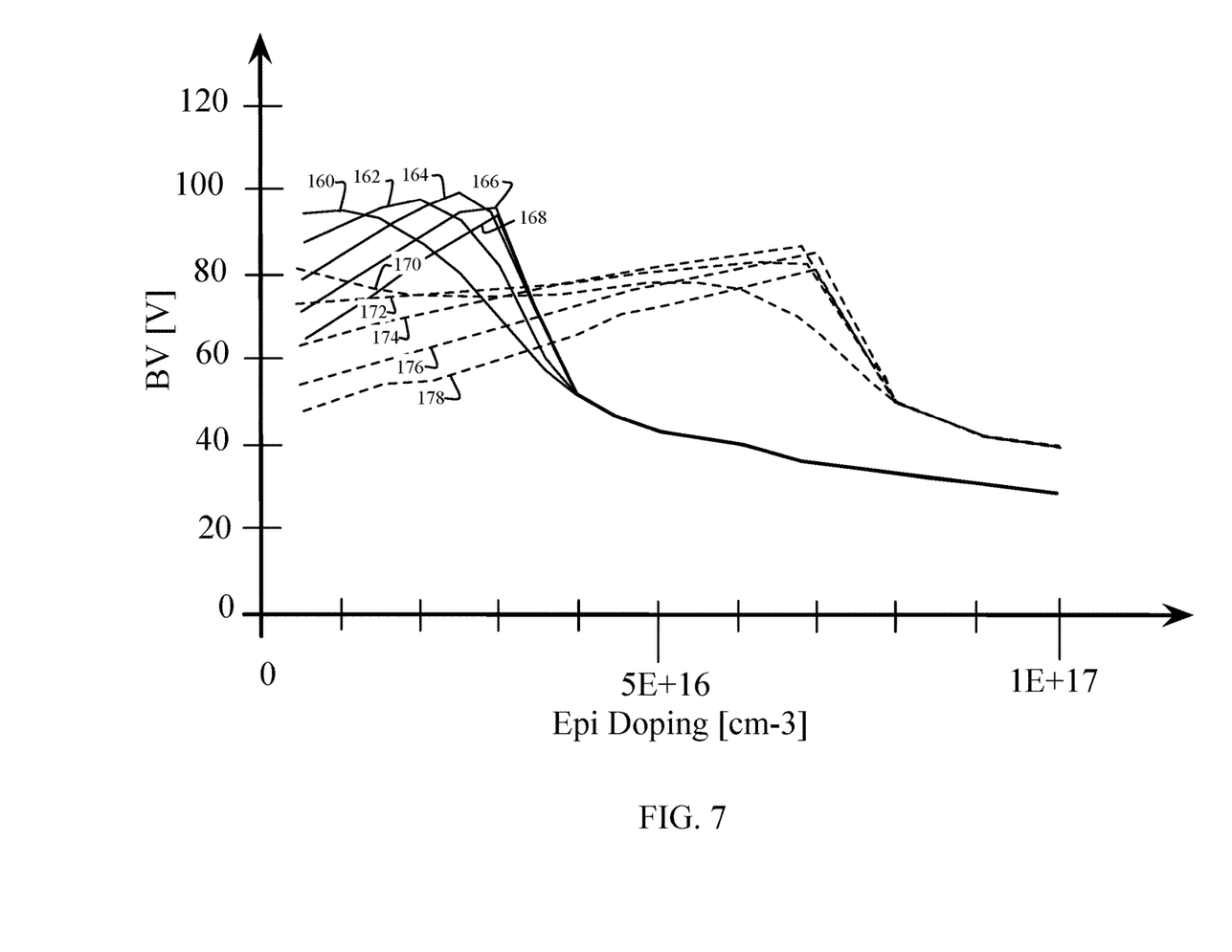
FIG. 7 is a graphical view of simulation results for breakdown voltage as a function of epitaxial layer doping concentration for an embodiment of a conventional power MOSFET.
Figure 8:
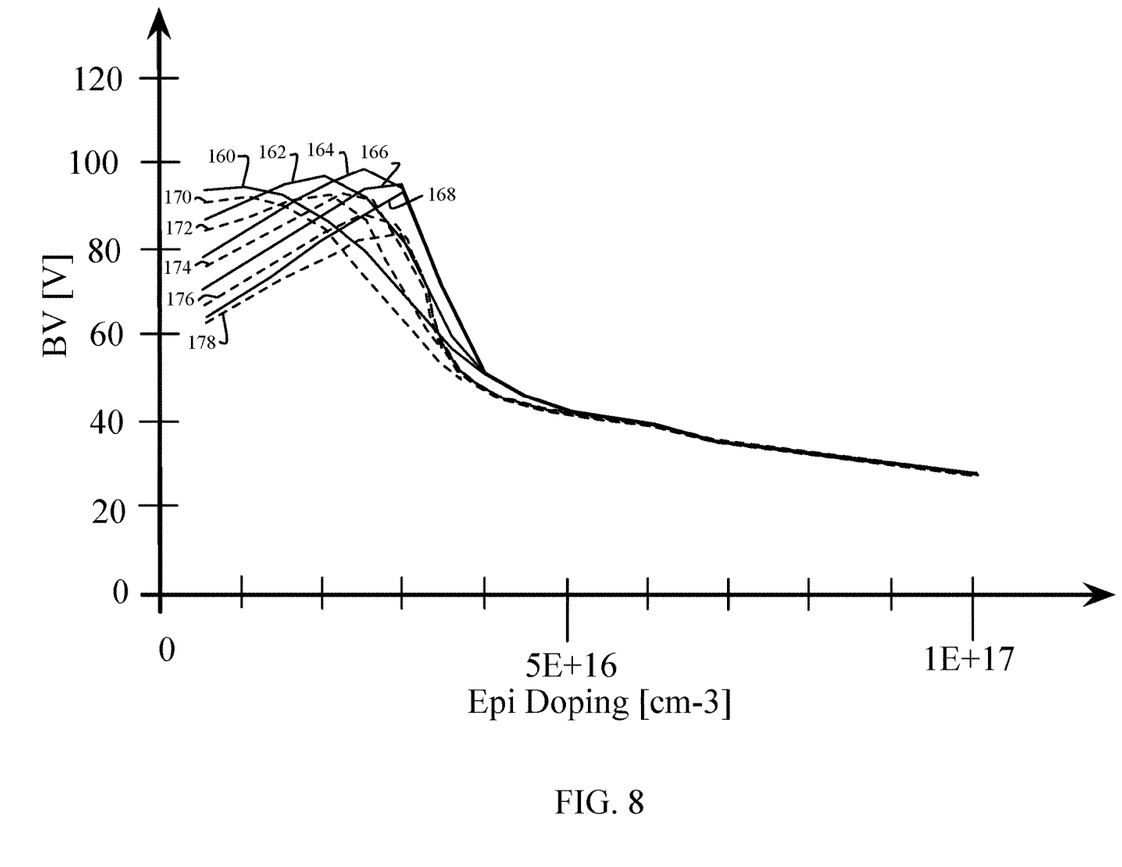
FIG. 8 is a graphical view of simulation results for breakdown voltage as a function of epitaxial layer doping concentration for an embodiment of a power MOSFET in accordance with the present disclosure.

FIG. 7 and FIG. 8 respectively compare the optimization of the doping concentration in the epitaxial layer of a MOSFET for a conventional approach to the approach disclosed herein. With reference to FIG. 7, the solid line traces 160, 162, 164, 166 and 168 correspond to a trench depth of 4 um, 4.5 um, 5 um, 5.5 um and 6 um respectively at location 156a (see FIG. 5). In contrast, the dashed line traces 170, 172, 174, 176 and 178 correspond to a trench depth of 4 um, 4.5 um, 5 um, 5.5 um and 6 um respectively at location 158a (see FIG. 5). Location 158a includes all areas where one trench rotates around the silicon mesa 38a. Location 156a includes the areas where the two trenches extend in a straight line parallel to each other.

FIG. 7 shows the data that corresponds to the conventional design, which is shown in FIG. 5. The two sets of curves, (solid and dashed), correspond to the breakdown in regions 156a and 158a respectively. Note that there is a great mismatch between the two breakdown sets. The overall breakdown for the conventional design is determined by the minimum of the two sets for certain epi-layer doping and trench depths. As can be seen, increasing the breakdown at one location (156a or 158a), does not guarantee high breakdown at the other location. The optimal epitaxial doping concentration to maximize the breakdown voltage is approximately 3E+16 cm-3 for location 156a and 7E+16 cm-3 for location 158a shown in FIG. 5. Choosing a doping concentration of 3E+16 cm-3 will result in a low breakdown voltage at location 158a and conversely a choice of 7E+16 cm-3 will result in the breakdown voltage being limited by location 156a. By choosing a compromise doping level of approximately 4E+16 cm-3 the best breakdown voltage that can be achieved is reduced from 100V to approximately 65V in one example with the layout of FIG. 5.

FIG. 8 corresponds to the new design disclosed herein, which is shown in FIG. 6. Here the two sets of curves again correspond to the breakdown simulation in regions 156 and 158. It is seen that the breakdown values are similar for these two regions for any epi-layer doping and/or trench depth combination, thereby producing a better design achieving a higher breakdown voltage. The optimal doping concentration for both regions 156 and 158 are similar when using the embodiments of this disclosure. Accordingly, the epitaxial doping concentration can be optimized to maximize the breakdown voltage BVdss, while minimizing the on resistance RDSon.

Figure 9:
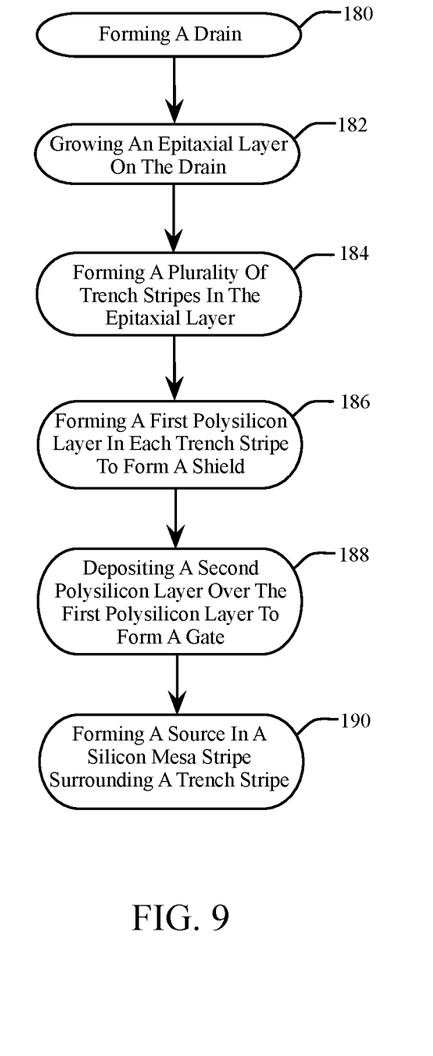
FIG. 9 is a flowchart representation of a method for fabricating a semiconductor device in accordance with an embodiment of the present disclosure.

FIG. 9 shows a flowchart of a method for fabrication of an embodiment of the trench superjunction power MOSFET. At 180, a drain is formed on a doped semiconductor substrate 90. At 182, an epitaxial layer 92 is grown on the drain. At 184, a plurality of trench stripes are formed in the epitaxial layer 92. At 186, a first polysilicon layer is formed in each of the trench stripes to form a shield (e.g., a first shield 30). At 188, a second polysilicon layer is formed over the first polysilicon layer to form a gate (e.g., a first gate 20). At 190, a source is formed in a silicon mesa stripe surrounding a trench stripe.

As will be appreciated, embodiments as disclosed include at least the following. In one embodiment, a semiconductor device comprises a first trench stripe extending from a top region of a first surface of the semiconductor device to a bottom region of the first surface. A silicon mesa stripe extends adjacent to a first side and a second side of the first trench stripe, and a termination end of the first trench stripe connected therebetween. The first side opposes the second side. A first gate is in the first trench stripe, spanning a middle region between the top region and the bottom region. A first full shield is in the first trench stripe, extending between a drain and the first surface and proximal to the bottom region. The drain is formed in a semiconductor substrate opposing the first surface. A first partial shield is in the first trench stripe, extending between the drain and the first gate, and connected to the first full shield. The first full shield is connected to a second partial shield between a second gate and the drain, and a third partial shield between a third gate and the drain, the second gate in a second trench stripe, the third gate in a third trench stripe, and the first gate interposed between the second gate and the third gate. A source is formed on the silicon mesa stripe, wherein the source, the first gate and the drain are terminals of a field effect transistor.

Alternative embodiments of the semiconductor device include one of the following features, or any combination thereof. A second full shield is between the first surface and the drain, and encircles the first full shield. The second full shield is connected to a fourth partial shield between a fourth gate and the drain, and a fifth partial shield between the fifth gate and the drain, the fourth gate in a fourth trench stripe, the fifth gate in a fifth trench stripe, the fourth gate interposed between the second gate and the first gate, and the fifth gate interposed between the third gate and the first gate. A first full shield contact connects a first conductor to the first full shield at an intersection of an extension of the first full shield towards the first partial shield, a first semicircular portion connects the first full shield to the second partial shield and a second semicircular portion connects the first full shield to the third partial shield, the first semicircular portion encircles a fourth partial shield interposed between the first partial shield and the second partial shield, and the second semicircular portion encircles a fifth partial shield interposed between the first partial shield and the third partial shield. A second conductor is orthogonal to the first trench stripe, the second conductor contacts the first gate, the second gate and the third gate in the middle region are proximate to the top region, and in the middle region are proximate to the bottom region. A third conductor is orthogonal to the first trench stripe, the third conductor contacts the source in the middle region. The third conductor contacts the source through a plurality of contacts in the middle region on the silicon mesa stripe adjacent to the first side and the second side of the first trench stripe. A buried body region is parallel to the first trench stripe, and extends from the top region to the bottom region, the buried body region includes a first contact in the bottom region connected to a first conductor, the first conductor connects to the first full shield, and a plurality of second contacts in the middle region connects to a third conductor, the third conductor connects to the source. A first conductor connects to the first full shield and the source. A radius of curvature of the termination end of the first trench stripe is equal to half the width of the first trench stripe. The first full shield connects the first partial shield to the second partial shield with a first semicircular portion surrounding a fourth partial shield, and the first full shield connects the first partial shield to the third partial shield with a second semicircular portion surrounding a fifth partial shield. The semiconductor device is formed in a single metal semiconductor process.

In another embodiment, a method for fabricating a semiconductor device comprises forming a drain with a doped semiconductor substrate. An epitaxial layer is grown on the drain. A plurality of trench stripes is formed in the epitaxial layer. Each of the trench stripes are disposed in parallel with another of the trench stripes and extends from a top region of a first surface of the semiconductor device to a bottom region of the first surface. The first surface opposes the doped semiconductor substrate. A first polysilicon layer is formed in each of the trench stripes separated from the epitaxial layer by a trench drift oxide. The first polysilicon layer extends between the drain and the first surface proximal to the top region and the bottom region. The first polysilicon layer extends between the drain and a level below the first surface in a middle region between the top region and the bottom region. A second polysilicon layer is deposited over the first polysilicon layer in the middle region. The second polysilicon layer is separated from the first polysilicon layer by an inter-poly dielectric, wherein the first polysilicon forms a shield, and the second polysilicon forms a gate. A source is formed in a silicon mesa stripe surrounding the first trench stripe.

Alternative embodiments of the method for fabricating a semiconductor device include one of the following features, or any combination thereof. A buried body region is formed between at least two of the trench stripes, extending from the top region to the bottom region, the buried body region connects the first polysilicon layer to the source. A first semicircular trench is formed between a first one and a second one of the trench stripes, a second semicircular trench is formed between the first one and a third one of the trench stripes, the first semicircular trench encircles a fourth trench stripe, the second semicircular trench encircles a fifth trench stripe, the first semicircular trench and the second semicircular trench include the first polysilicon layer. A contact is formed between the first polysilicon layer and a first conductor at an intersection of an extension of the first trench stripe towards the middle region, the first semicircular trench and the second semicircular trench. The metal interconnect comprises forming the metal interconnect with a single metal process.

In another embodiment, a semiconductor device comprises a drain in a doped semiconductor substrate. An epitaxial layer is on the drain. A plurality of trench stripes are disposed in parallel in the epitaxial layer and extends from a top region of a first surface of the semiconductor device to a bottom region of the first surface. The first surface opposes the doped semiconductor substrate. A first polysilicon layer is in each of the trench stripes, separated from the epitaxial layer by a trench drift oxide. The first polysilicon layer extends between the drain and the first surface proximal to the top region and the bottom region. The first polysilicon layer extends between the drain and a level below the first surface in a middle region between the top region and the bottom region. A second polysilicon layer is over the first polysilicon layer in the middle region. The second polysilicon layer is separated from the first polysilicon layer by an inter-poly dielectric, wherein the first polysilicon layer forms a shield, and the second polysilicon layer forms a gate. A source is in a silicon mesa stripe surrounding the first trench stripe.

Alternative embodiments of the semiconductor device include one of the following features, or any combination thereof. A first semicircular trench is between a first one and a second one of the trench stripes, a second semicircular trench is between the first one and a third one of the trench stripes, the first semicircular trench encircles a fourth trench stripe, the second semicircular trench encircles a fifth trench stripe, the first semicircular trench and the second semicircular trench include the first polysilicon layer, a contact is between the first polysilicon layer and a first conductor at an intersection of an extension of the first trench stripe towards the middle region, the first semicircular trench and the second semicircular trench. Each of the trench stripes has one termination end having a radius of curvature equal to half the width of the respective trench stripe.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for fabricating a semiconductor device comprising:
   forming a drain with a doped semiconductor substrate;
   growing an epitaxial layer on the drain;
   forming a plurality of trench stripes in the epitaxial layer, each of the trench stripes disposed in parallel with another of the trench stripes and extending from a top region of a first surface of the semiconductor device to a bottom region of the first surface, the first surface opposing the doped semiconductor substrate;
   forming a first polysilicon layer in each of the trench stripes separated from the epitaxial layer by a trench drift oxide, the first polysilicon layer extending between the drain and the first surface proximal to the top region and the bottom region, the first polysilicon layer extending between the drain and a level below the first surface in a middle region between the top region and the bottom region;
   depositing a second polysilicon layer over the first polysilicon layer in the middle region, the second polysilicon layer separated from the first polysilicon layer by an inter-poly dielectric, wherein the first polysilicon forms a shield, and the second polysilicon forms a gate; and
   forming a source in a silicon mesa stripe surrounding the first trench stripe, wherein the method further comprises:
   forming a first semicircular trench between a first one and a second one of the trench stripes, forming a second semicircular trench between the first one and a third one of the trench stripes, the first semicircular trench encircling a fourth trench stripe, the second semicircular trench encircling a fifth trench stripe, the first semicircular trench and the second semicircular trench including the first polysilicon layer.

2. The method of claim 1 further comprising forming a buried body region between at least two of the trench stripes, extending from the top region to the bottom region, the buried body region connecting the first polysilicon layer to the source.

3. The method of claim 1 further comprising forming a contact between the first polysilicon layer and a first conductor at an intersection of an extension of the first trench stripe towards the middle region, the first semicircular trench and the second semicircular trench.

4. A semiconductor device comprising:
   a drain in a doped semiconductor substrate;
   an epitaxial layer on the drain;
   a plurality of trench stripes disposed in parallel in the epitaxial layer and extending from a top region of a first surface of the semiconductor device to a bottom region of the first surface, the first surface opposing the doped semiconductor substrate;
   a first polysilicon layer in each of the trench stripes, separated from the epitaxial layer by a trench drift oxide, the first polysilicon layer extending between the drain and the first surface proximal to the top region and the bottom region, the first polysilicon layer extending between the drain and a level below the first surface in a middle region between the top region and the bottom region;
   a second polysilicon layer over the first polysilicon layer in the middle region, the second polysilicon layer separated from the first polysilicon layer by an inter-poly dielectric, wherein the first polysilicon layer forms a shield, and the second polysilicon layer forms a gate; and
   a source in a silicon mesa stripe surrounding the first trench stripe, wherein the device further comprises:
   a first semicircular trench between a first one and a second one of the trench stripes, a second semicircular trench between the first one and a third one of the trench stripes, the first semicircular trench encircling a fourth trench stripe, the second semicircular trench encircling a fifth trench stripe, the first semicircular trench and the second semicircular trench including the first polysilicon layer, a contact between the first polysilicon layer and a first conductor at an intersection of an extension of the first trench stripe towards the middle region, the first semicircular trench and the second semicircular trench.

5. The device of claim 4 wherein each of the trench stripes has one termination end having a radius of curvature equal to half the width of the respective trench stripe.

* * * * *